United States Patent
Medeiros et al.

(10) Patent No.: US 7,090,963 B2
(45) Date of Patent: Aug. 15, 2006

(54) PROCESS FOR FORMING FEATURES OF 50 NM OR LESS HALF-PITCH WITH CHEMICALLY AMPLIFIED RESIST IMAGING

(75) Inventors: David R. Medeiros, Dobbs Ferry, NY (US); Wu-Song Huang, Dobbs Ferry, NY (US); Gregory M. Wallraff, Morgan Hill, CA (US); Bill Hinsberg, Fremont, CA (US); Frances Houle, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,082

(22) Filed: Jun. 25, 2003

(65) Prior Publication Data

US 2004/0265747 A1 Dec. 30, 2004

(51) Int. Cl.
*G03C 5/00* (2006.01)

(52) U.S. Cl. .................. 430/311; 430/330; 430/322; 430/325; 430/323; 430/324

(58) Field of Classification Search ............... 430/322, 430/323, 330, 270.1, 324
See application file for complete search history.

(56) References Cited

U.S. PATENT DOCUMENTS

| | | | |
|---|---|---|---|
| 4,491,628 A | 1/1985 | Ito et al. | |
| 4,855,017 A | 8/1989 | Douglas | |
| 5,362,663 A | 11/1994 | Bronner et al. | |
| 5,429,710 A | 7/1995 | Akiba et al. | |
| 5,562,801 A | 10/1996 | Nulty | |
| 5,618,751 A | 4/1997 | Golden et al. | |
| 5,712,078 A | 1/1998 | Huang et al. | |
| 5,744,376 A | 4/1998 | Chen et al. | |
| 5,801,094 A | 9/1998 | Yew et al. | |
| 5,821,469 A | 10/1998 | Shanmughan | |
| 5,919,597 A | 7/1999 | Sinta et al. | |
| 6,037,097 A | 3/2000 | Bucchignano et al. | |
| 6,043,003 A | 3/2000 | Bucchignano et al. | |
| 6,227,546 B1 | 5/2001 | Halling | |
| 6,399,273 B1 * | 6/2002 | Yamada et al. | 430/270.1 |
| 2002/0182534 A1 * | 12/2002 | Varanasi et al. | 430/270.1 |

FOREIGN PATENT DOCUMENTS

| | | |
|---|---|---|
| JP | 01-157527 | 6/1989 |
| JP | 03-282553 | 12/1991 |
| JP | 05-072747 | 3/1993 |
| JP | 08-15865 | 1/1996 |
| JP | 09-320930 | 12/1997 |
| JP | 10-208997 | 8/1998 |
| JP | 11-072928 | 3/1999 |
| JP | 11-194506 | 7/1999 |
| JP | 11-271965 | 10/1999 |
| JP | 2002-043215 | 2/2002 |

* cited by examiner

*Primary Examiner*—John A. McPherson
*Assistant Examiner*—Daborah Chacko-Davis
(74) *Attorney, Agent, or Firm*—Steven Capella

(57) ABSTRACT

Lithographic imaging of 50 nm (or less) half-pitch features in chemically amplified resists (commonly used in the manufacture of integrated circuits) is enabled by the use of reduced temperature post-exposure processing and low activation energy chemically amplified resists. The post-exposure processing preferably involves ambient to moderately elevated temperature and the presence of a deprotection reaction-dependent co-reactant (e.g., water).

15 Claims, No Drawings

PROCESS FOR FORMING FEATURES OF 50 NM OR LESS HALF-PITCH WITH CHEMICALLY AMPLIFIED RESIST IMAGING

STATEMENT OF GOVERNMENT INTEREST

The U.S. Government has a paid-up license in this invention and the right in limited circumstances to require the patent owner to license others on reasonable terms as provided for by the terms of (contract No. DARPA N66001-00-C-8803) awarded by the Defense Advanced Research Project Agency (DARPA).

BACKGROUND OF INVENTION

The microelectronics industry strives toward fabricating high density circuitry by decreasing the minimum feature size of the components on the chip. This requires high-resolution lithography, the principal technique used in patterning microelectronics circuitry. Over approximately the last 20 years, the industry has migrated to shorter wavelength photolithography as the primary means of scaling the resolution to sustain the progressive demand for smaller features. The wavelength of photolithography has migrated from mid-ultraviolet (MUV) wavelengths (350450 nm) to deep-UV (DUV) radiation (190–300 nm) and vacuum UV (VUV, 125–160 nm). Likewise the photosensitive materials used in photolithography, photoresists, have evolved. MUV lithography employed diazonaphthoquinone (DNQ) and novolak-based resists. These materials offered high performance but were not extendible to DUV and VUV wavelengths due to their opacity at these shorter wavelengths. In addition, these resists were not of sufficient sensitivity to afford high throughput manufacturing.

In response to the need for new, lower opacity, higher sensitivity materials for DUV imaging, Ito et al. disclosed (U.S. Pat. No. 4,491,628) the development of chemically amplified resists (CARs) based on the photochemically-generated-acid (from a photosensitive acid generator) catalyzed deprotection of acid-labile polymer. That is, for positive tone CARs, labile moieties of the polymer are cleaved by acid catalyzed thermolysis reaction that renders the deprotected form of the polymer soluble in a subsequently applied developer, such as aqueous base. Thus, an image of the projected patternwise radiation is formed in the resist film after development, which can then serve as an etch-resistant mask for subsequent pattern transfer steps. The resolution obtained is dependent on quality of aerial image and ability of resist to maintain that image.

CARs have been developed for 248, 193, and 157 nm lithography. The theoretical dimensional limit of equal-sized half-pitch features is one quarter of the wavelength, $\hat{\lambda}\gg$ (k1=0.25) when NA=1, as the dose applied to the resist is equal to the square of the intensity, and thus the resolution cannot be modulated by any more than $\hat{\lambda}\gg/4$, or a pitch of $\hat{\lambda}\gg/2$. The resolution attainable with each advancing generation of materials has been extended toward these limits through the use of low k1 techniques and high numerical aperture tools. For the latest VUV wavelength being developed for manufacturing, 157 nm, with a very high but potentially manufacturable NA of 0.95, $\hat{\lambda}\gg/4$ equals ~40 nm. To obtain images below this feature size, either an extension of NA to >1, such as is afforded with immersion lithography or with a non-diffraction limited, non-optical lithography system, such the so-called next generation lithography (NGL) options. The most promising of these NGLs are extreme ultraviolet (EUV, sometimes referred to as soft x-ray) or electron beam lithography (EBL).

One barrier to imaging in the sub-50 nm half-pitch regime is a phenomenon known as image blur diminishes the integrity of the pattern (Hinsberg et al., *Proc. SPIE*, 2000, 3999, 148 and Houle et al., *J. Vac. Sci. Technol B*, 2000, 18, 1874). Image blur can be defined as the deviation of the developable image from that of projected aerial image which is transferred into the film as the concentration of photo-chemically generated acid. While accelerating the rate of the deprotection reaction, the application of thermal energy diminishes the fidelity of the aerial image of acid formed during the patternwise exposure. Image blur can be divided into two contributing factors: gradient-driven acid diffusion and reaction propagation. Both factors contribute to blur, but to different degrees and with different temperature dependence.

The first factor contributing to image blur is often referred to as acid diffusion and can be described by Fickian diffusion models for solids (Hinsberg, 2000). Choice of the photoacid being generated from photoacid generator (PAG) and the mobility in the chosen polymer matrix dictate this factor. The mobility in the polymer matrix is dependent on the comprising chemical functionality of the polymer, the free volume of the matrix, the glass transition temperature (Tg) of the polymer and the temperature and time of baking steps encountered during the resist processing.

A second contributing factor to image blur is sometimes described as reaction propagation (Hinsberg, 2000; Houle, 2000) and is best described by Arhenius behavior. Activation energy (enthalpy), volatility of products (entropy), and the availability and concentration of deprotection-reaction-dependent co-reactants such as moisture dictate the degree to which the reaction propagates away from the original acid profile.

In order to achieve high resolution, high sensitivity and high degree of process latitude, both image blur factors must be eliminated or minimized. Both of these contributing factors can be tempered by the addition of acid-quenchers, or bases, which have been shown to reduce image blur. Additionally it has been recognized that image blur is temperature dependent. Breyta et al. disclose that appropriate baking conditions can optimize the resolution attainable with CARs in U.S. Pat. No. 6,227,546. However, since the extent of thermally induced image blur has been estimated to be on the order of 10–50 nm with conventional resist processing schemes by various researchers (Hinsberg 2000; Houle 2000; Krasnaperova et al., *J. Vac. Sci. Technol. B*, 1994, 12, 3900; Lin et al, *Science* 2002, 297, 372), processing that reduces this phenomenon further are desirable and necessary to reach the sub-50 nm half-pitch regime of imaging.

Thus, remains a need for reliable methods of performing sub-50 nm half-pitch imaging.

SUMMARY OF INVENTION

The present invention provides lithographic imaging methods for use in the manufacture of integrated circuits or other similarly patterned structures of very high resolution, patterned structures having especially features having a half-pitch of about 50 nm or less. The methods of the invention enable minimization or elimination of blur.

The invention encompasses methods of forming a material structure on a substrate, the material structure having a pattern containing features having a half pitch of about 50 nm or less, the method comprising:

(A) providing a substrate with a layer of the material,
(B) applying a positive resist composition to the substrate to form a resist layer on the substrate, the resist composition comprising (a) an acid-sensitive imaging polymer matrix, and (b) a radiation-sensitive acid generator, the imaging polymer matrix comprising a pendant acid-labile moiety having a low activation energy for acid-catalyzed cleaving,
(C) patternwise exposing the substrate to radiation whereby acid is generated by the radiation-sensitive acid generator in exposed regions of the resist layer,
(D) post-exposure processing of the exposed resist layer in the presence of a deprotection reaction-dependent co-reactant for a time sufficient to promote the acid-catalyzed reaction in exposed portions of the resist layer but not so long as to cause resolution degradation due to acid diffusion-induced blur,
(E) developing a patterned resist structure in the resist layer by removing radiation exposed portions of the resist, and
(F) transferring resist structure pattern to the material layer by etching or ion implanting into the material layer through spaces in the resist structure pattern.

In another aspect, the invention encompasses a method of forming a material structure on a substrate, the material structure having a containing features having a half pitch of about 50 nm or less, the method comprising:
(A) providing a substrate,
(B) applying a positive resist composition to the substrate to form a resist layer on the substrate, the resist composition comprising (a) an acid-sensitive imaging polymer matrix, and (b) a radiation-sensitive acid generator, the imaging polymer matrix comprising a pendant acid-labile moiety having a low activation energy for acid-catalyzed cleaving,
(C) patternwise exposing the substrate to radiation whereby acid is generated by the radiation-sensitive acid generator in exposed regions of the resist layer,
(D) post-exposure processing of the exposed resist layer in the presence of a deprotection reaction-dependent co-reactant for a time sufficient to promote the acid-catalyzed reaction in exposed portions of the resist layer but not so long as to cause resolution degradation due to acid diffusion-induced blur,
(E) developing a patterned resist structure in the resist layer by removing radiation exposed portions of the resist, and
(F) transferring resist structure pattern to the material by depositing the material onto the substrate at spaces in the resist structure pattern.

The deposition of step (F) is preferably done by electroplating, chemical vapor deposition or physical vapor deposition.

The acid labile moiety is preferably selected from the group consisting of acetals, ketals, orthoesters, and other low activation energy species. Water is a preferred co-reactant. The post-exposure processing is preferably done at a temperature of about 15–75 Â° C., in a water vapor-containing atmosphere having a relative humidity of about 10 to 80% for about 0.5 to 30 minutes. The material to be patterned is preferably selected from the group consisting of organic dielectrics, metals, ceramics, and semiconductors.

These and other aspects of the invention are described in further detail below.

DETAILED DESCRIPTION

The present invention relates to methods for generating a high-resolution resist image on a substrate. The invention encompasses a method of forming a material structure on a substrate, the material structure having a pattern containing features having a half pitch of about 50 nm or less, the method comprising:
(A) providing a substrate with a layer of the material,
(B) applying a positive tone resist composition to the substrate to form a resist layer on the substrate, the resist composition comprising (a) an acid-sensitive imaging polymer matrix, and (b) a radiation-sensitive acid generator, the imaging polymer matrix comprising a pendant acid-labile moiety having a low activation energy for acid-catalyzed cleaving,
(C) patternwise exposing the substrate to radiation whereby acid is generated by the radiation-sensitive acid generator in exposed regions of the resist layer,
(D) post-exposure thermal processing of the exposed resist layer in the presence of a deprotection reaction-dependent co-reactant for a time sufficient to promote the acid-catalyzed reaction in exposed portions of the resist layer but not so long as to cause resolution degradation due to acid diffusion-induced blur,
(E) developing a patterned resist structure in the resist layer by removing radiation exposed portions of the resist, and
(F) transferring resist structure pattern to the material layer by etching or ion implanting into the material layer through spaces in the resist structure pattern.

The substrate may be any desired substrate such as a semiconductor wafer, a mask blank, etc. The substrate is preferably a silicon semiconductor wafer. The substrate may or may not additional layers of materials already deposited on it, including patterned layers containing multiple materials in the form of device features, wires, and the like. The material layer to be patterned by the process of the invention is preferably selected from the group consisting of organic dielectrics, metals, ceramics, and semiconductors. The material layer may be formed by any conventional technique (e.g., by implanting, spin-coating, CVD, PVD, etc.). The invention is not limited to any specific substrate, material layer or method of providing such material layer.

The chemically amplified resist layer preferably comprises (a) a polymer matrix containing acid labile protecting groups, and (b) a radiation sensitive acid generator.

The matrix polymer may be a homopolymer, copolymer, terpolymer or a polymer consisting of four or more differing monomeric repeat units. The polymers comprising more than one type of monomer (copolymer, terpolymer, etcâ) shall hereto be referred to simply as copolymer for simplicity but with the understanding that more than two monomer types may comprise the polymeric entity. The polymers will preferably have a molecular weight of about 1000 to 50,000 Daltons (more preferably about 2000 to 10000) and will preferably have a polydispersity between 1 and 5. Examples of suitable polymers include poly(hydroxystyrene), poly (vinylbenzoic acid), poly(acrylic acid), poly (methacrylic acid), poly(norbornene carboxylic acid), poly(5-(1,1,1,3,3, 3-hexafluoromethyl-2-hydroxy propyl)norbornene), poly (hydroxy perfluorostyrene), and derivatives and copolymers thereof. The most preferred polymer are copolymers of poly(4-hydroxystyrene).

Acid labile moieties are preferably pendant from the matrix polymer and/or are provided in the polymer matrix as separate dissolution inhibitor molecules containing acid labile moieties. The dissolution inhibitor preferably does not act as crosslinker when its acid labile moiety or moieties are cleaved. The acid labile moieties are preferably cleavable in the presence of acid at a temperature at which image blur is minimized or avoided. In a preferred embodiment, the acid labile moieties are cleavable in the presence of acid at room temperature. Preferred acid labile moieties are those classified as low activation energy protecting groups (e.g., Ea <20 kcal/mol.). The lability of the acid labile moieties is preferably dependent on the presence of a co-reactant which enables and/or facilitates the cleaving of the acid labile group in the presence of generated acid. The co-reactant is preferably water or an alcohol, more preferably water. The co-reactant may be present in the resist layer prior to imaging and/or may be introduced during or after imaging. Preferably, the co-reactant is not present in the resist prior to exposure to imaging radiation.

The acid labile moieties are preferably selected from the group consisting of acetals, ketals, and orthoesters, more preferably, the acid labile moieties are ketal moieties such as those described in U.S. Pat. No. 5,712,078 and EP Published Application EP0628876A1, the disclosures of which is incorporated herein by reference. Examples of preferred ketal protecting groups include, but are not limited to, methoxy propyl, methoxy cyclohexyl and benzyloxy propyl and derivatives and analogs thereof. For positive tone resists, the matrix polymer preferably contains about 5 and 95 mole % of the acid labile protecting groups (based on the total functional groups on the polymer), more preferably about 10 to 40 mole %, most preferably about 20 to 30 mole %. Preparation of such polymers is taught in U.S. Pat. Nos. 5,919,597 and 6,037,097 and 6,043,003, the disclosures of which are incorporated herein by reference. Methoxy cyclohexyl ketal is a most preferred protecting group. A variety of radiation-sensitive acid generators (PAGs) can be used in the CAR formulation used in the process of the present invention. Suitable PAGs include, but are not limited to, sulfonium and iodonium sulfonates, the anions of which may be totally or partially substituted with fluorine. Preferred examples include triaryl sulfonium perfluoroalkylsulfonates such as triphenylsulfonium triflate, triphenylsulfonium nonaflate, tris(t-butylphenyl)sulfonium triflate, t-butylphenyl diphenylsulfonium triflate, t-butylphenyl diphenylsulfonium nonaflate, t-butylphenyl diphenylsulfonium perfluorooctanesulfonate and similar derivatives and analogs. Other preferred PAGs are diaryl iodonium perfluoroalkane sulfonates (e.g., diphenyliodonium nonaflate and bis(t-butylphenyl) iodonium triflate), diaryl-alkyl sulfonium salts, dialkyl-arylsulfonium salts and derivatives thereof, triarylsulfonium bis(perfluoroalkyl)amides and tris(perfluoroalkyl)methides and the corresponding diaryliodonium analogs. Preferably, the resist formulation contains about 0.1 to 20 wt. % of the acid generator based on the weight of the polymer matrix, more preferably about 0.5–15 wt. %.

The resists used in the process of the present invention preferably include an acid quencher that can further limit the extent of image blur. Examples of such a quencher are known to those skilled in the art and include but are not limited to tetra-alkylammonium hydroxide, secondary and tertiary amines, pyridinium derivatives and the like. The composition preferably contains about 1 wt. % or less of quencher based on the total weight of polymer matrix. The resist may contain other known additives such as sensitizers, dyes, etc.

The resist are typically cast from an appropriate solvent. Preferred solvents are propylene glycol monomethyl ether acetate (PGMEA), ethyl lactate, cyclohexanone and the like.

The resist layer is preferably formed on the substrate by spin coating, slot coating or by other methods known to those skilled in the art. The coating thickness is preferably appropriate for the target feature size taking into consideration other factors such as the numerical aperture or resolution capability of the imaging device, the material layer to be patterned, etc.

After applying the resist, the resist layer is preferably baked mildly to remove the casting solvent (so-called post-application bake or PAB). The baking temperature is preferably such that the majority or all of the solvent is dispelled form the resist without causing thermally-induced deprotection or decomposition of resist components. Preferred baking temperature is about 80 to 120 Â° C., more preferably about 90 to 110 Â° C. The post-application bake step is preferably conducted for about 10 seconds to 15 minutes, more preferably about 15 seconds to one minute.

The resist layer is then exposed with imaging radiation in a pattern corresponding to a desired structure (to be created by pattern transfer to the underlying material layer) having features with a half pitch of about 50 nm or less. The exposure radiation is preferably selected from the group consisting of EUV radiation (13.4 nm), electron beams (EB), ion beams (IB), x-rays (1.4 nm, 1.1 nm), VUV (using extremely low k1 factor (~0.25) and NA >1) or DUV using extremely low k1 factor (~0.25) and NA >1). The exposure causes formation of a corresponding pattern of latent acid in the resist film.

The exposure step is preferably conducted in the substantial absence of deprotection-reaction-dependent co-reactants (or at least in the absence of such co-reactants in the environment surrounding the resist layer in the imaging tool). In embodiments where the resist used is a KRS-type resist, a co-reactant for deprotection reaction propagation is water. Thus, the exposure environment preferably has a relative humidity (RH) less than about 10%, more preferably less than about 1%, most preferably less than about 0.1%. EUV, EB, IB and x-ray exposure tools typically provide a moisture-free environment by providing high vacuum during the exposure. Optical radiation exposure tools can achieve a substantially anhydrous environment by use of vacuum or rigorous purging with a dry, inert gas such as nitrogen, helium or argon.

After the radiation exposure, a post-exposure environment containing one or more deprotection-reaction-dependent co-reactants is provided for the substrate. The environment preferably contains sufficient concentration of the deprotection-reaction-dependent co-reactant and has a temperature suitably low enough to prevent significant image blur, but not so low as to stop the deprotection reaction entirely. Where water is the co-reactant, the environment preferably has a relative humidity of about 10% to 80%, more preferably about 30% to 60%, most preferably about 35% to 50%. The temperature of the environment is preferably selected in combination with the concentration of co-reactant to provide a post-exposure treatment time on the order of 30 seconds to 45 minutes, more preferably about 1 to 30 minutes, most preferably about 1 to five minutes. The post-exposure environment temperature is preferably about 10 to 75 Â° C., more preferably about 15 to 60 Â° C., most preferably about 20 to 50 Â° C.

After the post-exposure treatment above, the resist pattern is then developed by contacting the resist with an aqueous alkaline developer or other known developing agent. A preferred developer is an aqueous solution of tetramethyl ammonium hydroxide (TMAH). A preferred concentration of the aqueous TMAH solution is about 0.05 to 0.4 N (normal), more preferably about 0.13 to 0.27 N. If desired, surfactants or other additives may be employed in the developer solution, e.g., to aid in solvation and/or to prevent image collapse.

The pattern from the resist structure may then be transferred to the material (e.g., organic dielectric, ceramic, metal or semiconductor) of the underlying substrate. Typically, the transfer is achieved by reactive ion etching, wet etching, ion implanting or some other suitable technique. The methods of the invention can be used to create patterned material layer structures such as metal wiring lines, holes for contacts or vias, insulation sections (e.g., damascene trenches or shallow trench isolation), trenches for capacitor structures, gate stacks, etc. as might be used in the design of integrated circuit devices. In some instances, a hard mask may be used below the resist layer to facilitate transfer of the pattern to a further underlying material layer or section. Examples of pattern transfer are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

In another aspect, the invention encompasses a method of forming a material structure on a substrate, the material structure having a containing features having a half pitch of about 50 nm or less, the method comprising:
(A) providing a substrate,
(B) applying a positive resist composition to the substrate to form a resist layer on the substrate, the resist composition comprising (a) an acid-sensitive imaging polymer matrix, and (b) a radiation-sensitive acid generator, the imaging polymer matrix comprising a pendant acid-labile moiety having a low activation energy for acid-catalyzed cleaving,
(C) patternwise exposing the substrate to radiation whereby acid is generated by the radiation-sensitive acid generator in exposed regions of the resist layer,
(D) post-exposure processing of the exposed resist layer in the presence of a deprotection reaction-dependent co-reactant for a time sufficient to promote the acid-catalyzed reaction in exposed portions of the resist layer but not so long as to cause resolution degradation due to acid diffusion-induced blur,
(E) developing a patterned resist structure in the resist layer by removing radiation exposed portions of the resist, and
(F) transferring resist structure pattern to the material by depositing the material onto the substrate at spaces in the resist structure pattern.

The deposition of step (F) is preferably done by electroplating, chemical vapor deposition or physical vapor deposition. The material to be deposited in step (F) is preferably selected from the group consisting of organic dielectrics, metals, ceramics, and semiconductors. The method may include additional steps such as lift-off or stripping of the resist layer such as are known in the art.

The examples presented below are for illustrative purposes only, and are not intended as a restriction on the scope of the invention.

EXAMPLE 1

A PGMEA diluted (3:1) solution of KRS-XE2 photoresist (Japan Synthetic Rubber Company) was cast on a silicon wafer and baked at 110 Å° C. for 60 s to afford a ~80 nm thick film. The film was exposed with 15 ÂµC/cm$^2$ (proximity corrected dose) of electron beam radiation (100 keV) under a vacuum (~$10^{-10}$–$10^9$ Torr) on a Leica VB6 direct write exposure system employing a generated pattern that projected equal line-space patterns of 100 nm pitch and below. Upon completion of the exposure, the wafer was removed and allowed to equilibrate in lab atmosphere (RH ~40%) for 30 min at 22 Å° C. The wafer was then developed with 0.26N TMAH developer (Shipley Microposit LD26) for 30 s. Resolution of 40 nm equal line-space features (80 nm pitch) with exhibited by cross-sectional scanning electron microscopy (SEM). For comparison, half-pitch features below 60 nm (120 nm pitch) were not attainable by an analogous process that included a post-exposure bake step (110 Å° C. for 60 s).

EXAMPLE 2

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 14 ÂµC/cm$^2$ (proximity corrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was removed and allowed to equilibrate in lab atmosphere (RH ~40%) for 30 min at 22 Å° C. The wafer was then developed with 0.26N TMAH developer (Shipley Microposit LD26) for 30 s. Resolution of 30 nm equal line-space features (60 nm pitch) with exhibited by cross-sectional scanning electron microscopy (SEM). For comparison, half-pitch features below 60 nm (120 nm pitch) were not attainable by an analogous process that included a post-exposure bake step (110 Å° C. for 60 s).

EXAMPLE 3

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 12 ÂµC/cm$^2$ (proximity corrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was removed and allowed to equilibrate in lab atmosphere (RH ~40%) for 2 min at 22 Å° C. The wafer was then developed with 0.26N TMAH developer (Shipley Microposit LD26) for 30 s. Resolution of 30 nm equal line-space features (60 nm pitch) with exhibited by cross-sectional scanning electron microscopy (SEM).

EXAMPLE 4

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 12 ÂµC/cm$^2$ (proximity corrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was baked at 50 Å° C. for 60 s. The wafer was then developed with 0.26N TMAH developer (Shipley Microposit LD26)

for 30 s. Resolution of 30 nm equal line-space features (60 nm pitch) with exhibited by cross-sectional scanning electron microscopy (SEM).

EXAMPLE 5

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 12 ÅµC/cm$^2$ (proximity corrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was removed and allowed to equilibrate in a humid atmosphere (RH ~75%) as afforded by a saturated aqueous solution of sodium chloride contained in dish over which the wafer was placed for 2 min at 22 Å° C. The wafer was then developed with 0.26N TMAH developer (Shipley Microposit LD26) for 30 s. Resolution of 30 nm equal line-space features (60 nm pitch) with exhibited by cross-sectional scanning electron microscopy (SEM).

EXAMPLE 6

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 28 ÅµC/cm$^2$ (uncorrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was removed and allowed to equilibrate in lab atmosphere (RH ~40%) for 30 min at 22 Å° C. The wafer was then developed with 0.26N TMAH developer (Shipley Microposit LD26) for 30 s. Resolution of 30 nm equal line-space features (60 nm pitch) with exhibited by top-down scanning electron microscopy (SEM).

EXAMPLE 7

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 30 ÅµC/cm$^2$ (uncorrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was removed and allowed to equilibrate in lab atmosphere (RH ~40%) for 2 min at 22 Å° C. The wafer was then developed with 0.26N TMAH developer (Shipley Microposit LD26) for 30 s. Resolution of 30 nm equal line-space features (60 nm pitch) with exhibited by top-down scanning electron microscopy (SEM).

EXAMPLE 8

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with 30 ÅµC/cm$^2$ (uncorrected dose) of electron beam radiation (100 keV) under a vacuum (~$10^{-10}$–$10^{-9}$ Torr) on a Leica VB6 direct write exposure system employing a generated pattern that projected equal line-space patterns of 100 nm pitch and below. Upon completion of the exposure, the wafer was post exposure baked for 1 min at 60 Å° C. The wafer was then developed with 0.26N TMAH developer (Shipley Microposit LD26) for 30 s. Resolution of 30 nm equal line-space features (60 nm pitch) with exhibited by top-down scanning electron microscopy (SEM).

EXAMPLE 9

A PGMEA diluted (4:1) solution of KRS-XE2 photoresist (Japan Synthetic Rubber Company) was cast on a silicon wafer and baked at 110 Å° C. for 60 s to afford a ~50 nm thick film. The film was exposed with EUV radiation (13.4 nm) using a transmission diffraction grating in an interferometric configuration under vacuum (~$10^{-3}$–$10^{-2}$ Torr). Two interfering beams of 30.8 eV photon energy of the radiation projected equal line-space patterns of 55 nm pitch and below. Typical exposure times varied between 8–10 s. Upon completion of the exposure, the wafer was removed and allowed to equilibrate in lab atmosphere (RH ~40%) for 30 min at 22 Å° C. The wafer was then developed with 0.26N TMAH developer (Shipley Microposit LD26) for 30 s. Resolution of 25 nm equal line-space features (50 nm pitch) with exhibited by top-down scanning electron microscopy (SEM).

The invention claimed is:

1. A method of forming a material structure on a substrate, said material structure having a pattern containing features having a half-pitch of about 50 nm or less, said method comprising:
   (A) providing a substrate with a layer of said material,
   (B) applying a positive tone resist composition to said substrate to form a resist layer on said substrate, said resist composition comprising (a) an acid-sensitive imaging polymer matrix, and (b) a radiation-sensitive acid generator, said imaging polymer comprising a pendant acid-labile moiety selected from the group consisting of ketals, acetals and orthoesters,
   (C) patternwise exposing said substrate to radiation whereby acid is generated by said radiation-sensitive acid generator in exposed regions of said resist layer,
   (D) treating the exposed resist layer with a deprotection reaction-dependent co-reactant at a temperature of about 20–50° C. for about 1 to 30 minutes to promote acid-catalyzed reaction in exposed portions of said resist layer but not so long as to cause resolution degradation due to acid diffusion-induced blur,
   (E) developing a patterned resist structure in said resist layer by removing radiation exposed portions of said resist if said resist is a positive tone resist, and
   (F) transferring resist structure pattern to said material layer by removing portions of said material layer through spaces in said resist structure pattern.

2. The method of claim 1 wherein said material is selected from the group consisting of organic dielectrics, metals, ceramics, and semiconductors.

3. The method of claim 1 wherein said transfer of step (F) comprises reactive ion etching.

4. The method of claim 1 wherein at least one intermediate layer is provided between said material layer and said resist layer, and step (F) comprises etching through said intermediate layer.

5. The method of claim 1 wherein said deprotection reaction dependent co-reactant is present in the polymer film during exposure.

6. The method of claim 1 where water is employed as co-reactant.

7. The method of claim 6 wherein the treatment of step (D) is performed in a water vapor-containing atmosphere having a relative humidity of about 10 to 80%.

8. The method of claim 6 comprising providing a water-containing atmosphere at about 30 to 60% relative humidity.

9. The method of claim 1 wherein said exposure of step (C) is done under anhydrous conditions.

10. The method of claim 1 wherein step (D) is conducted for about 1 to 5 minutes.

11. The method of claim 1 wherein said radiation used in step (C) has a wavelength selected from the group consisting of 248 nm, 193 nm, 157 nm, 13.4 nm, 1.4 nm, and 11 nm.

12. The method of claim 1 wherein said radiation used in step (C) is extreme ultraviolet.

13. The method of claim 1 where said radiation used in step (C) is selected from the group consisting of with electron beam and ion beam.

14. A method of forming a material structure on a substrate, the material structure having a pattern containing features having a half-pitch of about 50 nm or less, the method comprising:

(A) providing a substrate, (B) applying a positive resist composition to the substrate to form a resist layer on the substrate, the resist composition comprising (a) an acid-sensitive imaging polymer matrix, and (b) a radiation-sensitive acid generator, the imaging polymer matrix comprising a pendant acid-labile moiety having a low activation energy for acid-catalyzed cleaving, (C) patternwise exposing the substrate to radiation whereby acid is generated by the radiation-sensitive acid generator in exposed regions of the resist layer, (D) post-exposure processing of the exposed resist layer in the presence of a deprotection reaction-dependent co-reactant at a temperature of about 20–50° C. for about 1 to 30 minutes to promote the acid-catalyzed reaction in exposed portions of the resist layer but not so long as to cause resolution degradation due to acid diffusion-induced blur, (E) developing a patterned resist structure in the resist layer by removing radiation exposed portions of the resist, and (F) transferring resist structure pattern to the material by depositing the material onto the substrate at spaces in the resist structure pattern.

15. The method of claim 14 wherein said deposition of step (F) is done by electroplating, chemical vapor deposition or physical vapor deposition.

\* \* \* \* \*